US012592183B2

(12) United States Patent     (10) Patent No.: US 12,592,183 B2

Wang et al.     (45) Date of Patent: Mar. 31, 2026

(54) DISPLAY DEVICE AND TEMPERATURE COMPENSATION METHOD

(71) Applicant: AUO Corporation, Hsinchu City (TW)

(72) Inventors: Jun Zheng Wang, Hsinchu City (TW);
Hong Jun Chen, Hsinchu City (TW);
Tsung-Lin Ma, Hsinchu City (TW)

(73) Assignee: AUO Corporation, Hsinchu City (TW)

( * ) Notice: Subject to any disclaimer, the term of this patent is extended or adjusted under 35 U.S.C. 154(b) by 5 days.

(21) Appl. No.: 18/938,265

(22) Filed: Nov. 5, 2024

(65) Prior Publication Data

US 2026/0073842 A1    Mar. 12, 2026

(30) Foreign Application Priority Data

Sep. 11, 2024    (TW) .................................. 113134438

(51) Int. Cl.
*G09G 3/20*    (2006.01)
*G09G 3/32*    (2016.01)
*H01L 25/16*    (2023.01)

(52) U.S. Cl.
CPC ............. *G09G 3/32* (2013.01); *H01L 25/167* (2013.01); *G09G 2320/0242* (2013.01); *G09G 2320/041* (2013.01)

(58) Field of Classification Search
None
See application file for complete search history.

(56) References Cited

U.S. PATENT DOCUMENTS

| | | | | |
|---|---|---|---|---|
| 2018/0082631 | A1* | 3/2018 | Chang | G09G 3/3648 |
| 2018/0286349 | A1* | 10/2018 | Mohammadi | G09G 3/20 |
| 2022/0406235 | A1* | 12/2022 | Pyun | G09G 3/20 |
| 2023/0326403 | A1 | 10/2023 | Huo | |
| 2024/0005850 | A1* | 1/2024 | Jang | G09G 3/32 |
| 2025/0087135 | A1* | 3/2025 | Zhang | G09F 9/00 |

FOREIGN PATENT DOCUMENTS

| | | |
|---|---|---|
| CN | 113410262 | 9/2021 |
| CN | 114822418 | 7/2022 |
| CN | 116543689 | 8/2023 |
| CN | 116884337 | 10/2023 |
| TW | 202414379 | 4/2024 |

* cited by examiner

*Primary Examiner* — Benjamin C Lee
*Assistant Examiner* — Emily J Frank
(74) *Attorney, Agent, or Firm* — JCIPRNET

(57) ABSTRACT

The present disclosure provides a display device and a temperature compensation method. This method includes: obtaining a temperature value through a temperature sensor which corresponds to an area of a pixel array in a display panel, in which the area contains multiple pixel structures; setting a down-sampling position in the aforementioned area and receiving a subpixel value corresponding to the down-sampling position; obtaining a compensation temperature value at the down-sampling position based on the temperature value; querying a lookup table according to the subpixel value and the compensation temperature value to obtain a compensation value; and generating a drive value based on the subpixel value and compensation value to drive the pixel structure at the down-sampling position, and updating the lookup table based on the drive value.

16 Claims, 6 Drawing Sheets

300

| Temperature ( °C ) | Brightness(cd/m$^2$) |
|---|---|
| 25 | 900 |
| 27 | 897 |
| 29 | 890 |
| 31 | 881 |
| 40 | 870 |
| 45 | 856 |
| 50 | 843 |

FIG. 3

Next frame

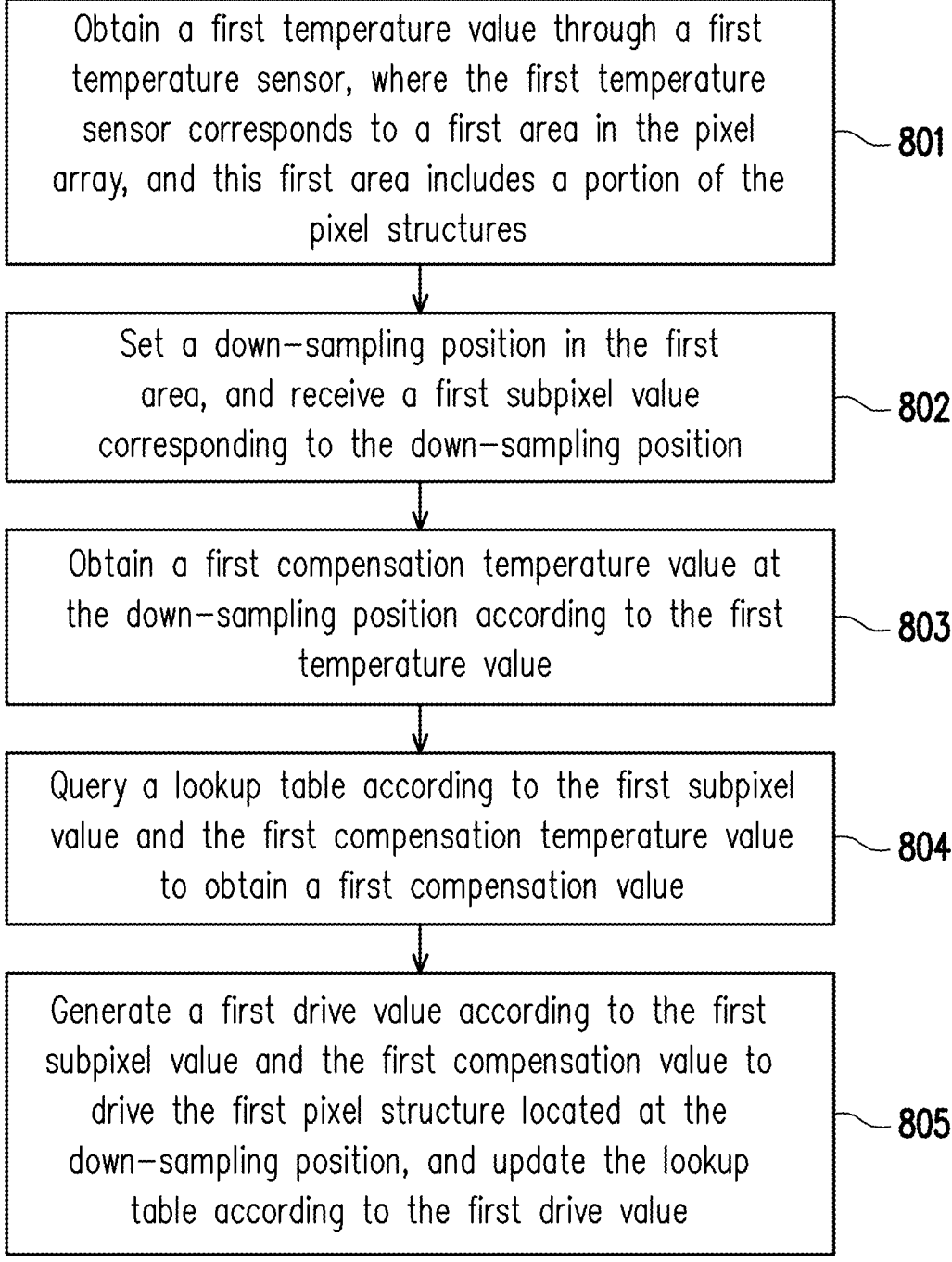

Obtain a first temperature value through a first temperature sensor, where the first temperature sensor corresponds to a first area in the pixel array, and this first area includes a portion of the pixel structures — 801

Set a down-sampling position in the first area, and receive a first subpixel value corresponding to the down-sampling position — 802

Obtain a first compensation temperature value at the down-sampling position according to the first temperature value — 803

Query a lookup table according to the first subpixel value and the first compensation temperature value to obtain a first compensation value — 804

Generate a first drive value according to the first subpixel value and the first compensation value to drive the first pixel structure located at the down-sampling position, and update the lookup table according to the first drive value — 805

FIG. 8

DISPLAY DEVICE AND TEMPERATURE COMPENSATION METHOD

CROSS-REFERENCE TO RELATED APPLICATION

This application claims the priority benefit of Taiwan application serial no. 113134438, filed on Sep. 11, 2024. The entirety of the above-mentioned patent application is hereby incorporated by reference herein and made a part of this specification.

BACKGROUND

Technical Field

The present disclosure relates to a display device and a temperature compensation method for compensating brightness degradation of light-emitting diodes due to temperature.

Description of Related Art

With the maturation and evolution of Light Emitting Diode (LED) technology, LEDs have been widely applied in various display devices and lighting equipment. However, as technology further develops, display technology has begun to evolve towards higher resolution, higher brightness, and smaller pixel sizes. Consequently, Micro Light Emitting Diode (µLED) has emerged. µLED technology utilizes the advantages of LEDs such as high brightness, low power consumption, and long lifespan, and applies them to sub-millimeter pixel structures, enabling high-resolution display and precise color control.

µLED display devices have begun to establish a certain position in the high-end display market, especially in wearable devices, micro-projectors, and high-resolution display panels. However, although µLED has many advantages, its performance is susceptible to environmental factors, particularly temperature variations which have a significant impact. When a µLED display panel operates in high or low temperature environments, due to the inconsistent temperature characteristics of LEDs of different colors, the displayed frame may exhibit noticeable color differences. These color differences can severely affect the user's visual experience.

SUMMARY

The present disclosure proposes a display device and temperature compensation method that may reduce the area of a driving circuit and may dynamically perform temperature compensation according to time and space.

The present disclosure proposes a display device, including a display panel, a first temperature sensor, and a temperature compensation circuit. The display panel includes a pixel array, and this pixel array includes multiple pixel structures. The first temperature sensor corresponds to a first area in the pixel array, and the first area includes a portion of the pixel structures. The first temperature sensor is used to obtain a first temperature value. The temperature compensation circuit is electrically connected to the first temperature sensor and is used to set a down-sampling position in the first area, and receive a first subpixel value corresponding to the down-sampling position. The temperature compensation circuit obtains a first compensation temperature value at the down-sampling position according to the first temperature value, queries a lookup table according to the first subpixel value and the first compensation temperature value to obtain a first compensation value, generates a first drive value to drive the first pixel structure located at the down-sampling position according to the first subpixel value and the first compensation value, and updates the lookup table according to the first drive value.

In an embodiment of the present disclosure, the aforementioned first subpixel value belongs to a first frame. The temperature compensation circuit replaces the first compensation value in the lookup table with the first drive value. The temperature compensation circuit is used to receive a second subpixel value belonging to a second frame, the first temperature sensor is used to obtain a second temperature value, and the temperature compensation circuit obtains a second compensation temperature value according to the second temperature value. When the second subpixel value is identical to the first subpixel value and the second compensation temperature value is identical to the first compensation temperature value, the temperature compensation circuit obtains the first drive value from the lookup table and generates a second drive value according to the first drive value and the second subpixel value to drive one of the pixel structures.

In an embodiment of the present disclosure, the aforementioned display device further includes a second temperature sensor, corresponding to a second area in the pixel array, where the second area is adjacent to the first area. The second temperature sensor is used to obtain a second temperature value. If the down-sampling position is different from the position of the first temperature sensor, the temperature compensation circuit is used to interpolate the first compensation temperature value according to the first temperature value and the second temperature value, wherein if the down-sampling position is identical to the position of the first temperature sensor, the temperature compensation circuit sets the first compensation temperature value to be identical to the first temperature value.

In an embodiment of the present disclosure, the second area is adjacent to the first area. The temperature compensation circuit is used to calculate a second drive value corresponding to the second area, interpolate a difference according to the first drive value and the second drive value, and adjust the subpixel value corresponding to a second pixel structure in the first area according to the difference, wherein the second pixel structure is different from the first pixel structure.

In an embodiment of the present disclosure, the aforementioned first subpixel value belongs to a first frame. For a second frame, the temperature compensation circuit is also used to change the down-sampling position to generate an updated sampling position in the first area, obtain a second subpixel value corresponding to the updated sampling position, where this second subpixel value belongs to the second frame. The first temperature sensor also obtains a second temperature value corresponding to the second frame. The temperature compensation circuit is used to obtain a second compensation temperature value at the updated sampling position according to the second temperature value, query the lookup table according to the second subpixel value and the second compensation temperature value to obtain a second compensation value, and generate a second drive value according to the second subpixel value and the second compensation value to drive the pixel structure located at the updated sampling position.

In an embodiment of the present disclosure, the aforementioned first area includes N pixel structures, and the temperature compensation circuit is used to set the updated sampling positions to correspond to the N pixel structures respectively during N frames, where N is a positive integer.

In an embodiment of the present disclosure, the aforementioned temperature compensation circuit is used to set multiple weights, and calculate a weighted sum of the first subpixel value and the first compensation value according to these weights to serve as the first drive value.

In an embodiment of the present disclosure, the aforementioned temperature compensation circuit is configured in an integrated circuit, where this integrated circuit is located in the display area of the display panel.

In an embodiment of the present disclosure, the aforementioned temperature compensation circuit includes a memory, used to store the lookup table.

In an embodiment of the present disclosure, each of the aforementioned pixel structures includes a micro light-emitting diode.

From another perspective, an embodiment of the present disclosure proposes a temperature compensation method, applicable to a display panel, where this display panel includes a pixel array, and the pixel array includes multiple pixel structures. The temperature compensation method includes: obtaining a first temperature value through a first temperature sensor, where the first temperature sensor corresponds to a first area in the pixel array, and the first area includes a portion of the pixel structures; setting a down-sampling position in the first area, and receiving a first subpixel value corresponding to the down-sampling position; obtaining a first compensation temperature value at the down-sampling position according to the first temperature value; querying a lookup table according to the first subpixel value and the first compensation temperature value to obtain a first compensation value; and generating a first drive value according to the first subpixel value and the first compensation value to drive a first pixel structure located at the down-sampling position, and updating the lookup table according to the first drive value.

In an embodiment of the present disclosure, the aforementioned first subpixel value belongs to a first frame. The temperature compensation method further includes: replacing the first compensation value in the lookup table with the first drive value; receiving a second subpixel value belonging to a second frame, obtaining a second temperature value through the first temperature sensor; obtaining a second compensation temperature value according to the second temperature value; and when the second subpixel value is identical to the first subpixel value and the second compensation temperature value is identical to the first compensation temperature value, obtaining the first drive value from the lookup table, generating a second drive value according to the first drive value and the second subpixel value to drive a pixel structure.

In an embodiment of the present disclosure, the aforementioned temperature compensation method further includes: obtaining a second temperature value through a second temperature sensor, where the second temperature sensor corresponds to a second area in the pixel array, and the second area is adjacent to the first area; if the down-sampling position is different from the position of the first temperature sensor, interpolating the first compensation temperature value according to the first temperature value and the second temperature value; and if the down-sampling position is identical to the position of the first temperature sensor, setting the first compensation temperature value to be identical to the first temperature value.

In an embodiment of the present disclosure, the second area is adjacent to the first area. The temperature compensation method further includes: calculating a second drive value corresponding to the second area; and interpolating a difference value according to the first drive value and the second drive value, and adjusting the subpixel value corresponding to a second pixel structure in the first area according to this difference value, where the second pixel structure is different from the first pixel structure.

In an embodiment of the present disclosure, the aforementioned first subpixel value belongs to a first frame. The temperature compensation method further includes: for a second frame, changing the down-sampling position to generate an updated sampling position in the first area, and obtaining a second subpixel value corresponding to the updated sampling position, where the second subpixel value belongs to the second frame; obtaining a second temperature value corresponding to the second frame through the first temperature sensor; obtaining a second compensation temperature value at the updated sampling position according to the second temperature value; and querying the lookup table according to the second subpixel value and the second compensation temperature value to obtain a second compensation value, generating a second drive value according to the second subpixel value and the second compensation value to drive the pixel structure located at the updated sampling position.

In an embodiment of the present disclosure, the aforementioned first area includes N pixel structures, and the temperature compensation method further includes: setting the updated sampling positions to correspond to the N pixel structures respectively over N frames, where N is a positive integer.

In an embodiment of the present disclosure, the step of generating the first drive value according to the first subpixel value and the first compensation value includes: setting multiple weights, calculating a weighted sum of the first subpixel value and the first compensation value according to these weights to serve as the first drive value.

To make the aforementioned features and advantages of the present disclosure more apparent and understandable, embodiments are described below with reference to the accompanying drawings in detail as follows.

BRIEF DESCRIPTION OF THE DRAWINGS

FIG. 3 is a table illustrating brightness degradation according to an embodiment.

FIG. 8 is a flowchart illustrating a temperature compensation method according to an embodiment.

DESCRIPTION OF THE EMBODIMENTS

Figure 1:
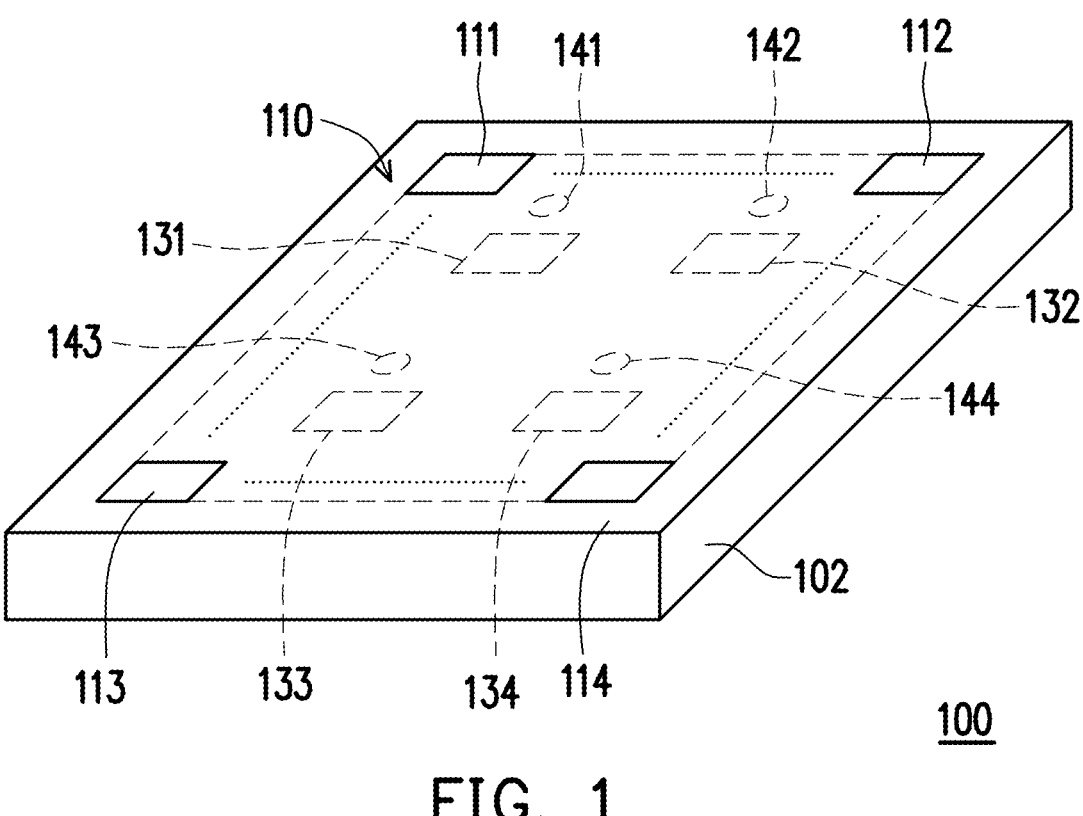
FIG. 1 is a schematic diagram illustrating a display device according to an embodiment.

Some embodiments of the present disclosure will now be described in detail with reference to the accompanying drawings. In the following description, when the same reference numerals appear in different drawings, they may be considered as the same or similar components. These embodiments are only a part of the invention and do not disclose all possible implementations of the invention. More precisely, these embodiments are examples of the systems and methods within the scope of the patent claims of the present disclosure.

Regarding the terms "first," "second," etc. used in this document, they do not particularly indicate order or sequence. They are only used to distinguish components or operations described using the same technical terms.

FIG. 1 is a schematic diagram illustrating a display device according to an embodiment. Referring to FIG. 1, a display device 100 includes a display panel 102, and the display panel 102 includes a pixel array 110. This pixel array 110 includes pixel structures (such as pixel structures 111-114) arranged in multiple rows and multiple columns, with each pixel structure including a light-emitting diode (which may be a micro light-emitting diode or a light-emitting diode of other sizes). The area where the pixel array 110 is located is also called a display area 120, in which multiple micro integrated circuits 131-134 and temperature sensors 141-144 are disposed.

For simplification, other components of the display device 100 are not shown in FIG. 1. For example, the display device 100 may also include one or more of a timing controller, a gate driver, a source driver, and a light guide plate. The display device 100 may be a television, a computer monitor, or a screen on any electronic device; the present disclosure is not limited in this regard.

Figure 2:
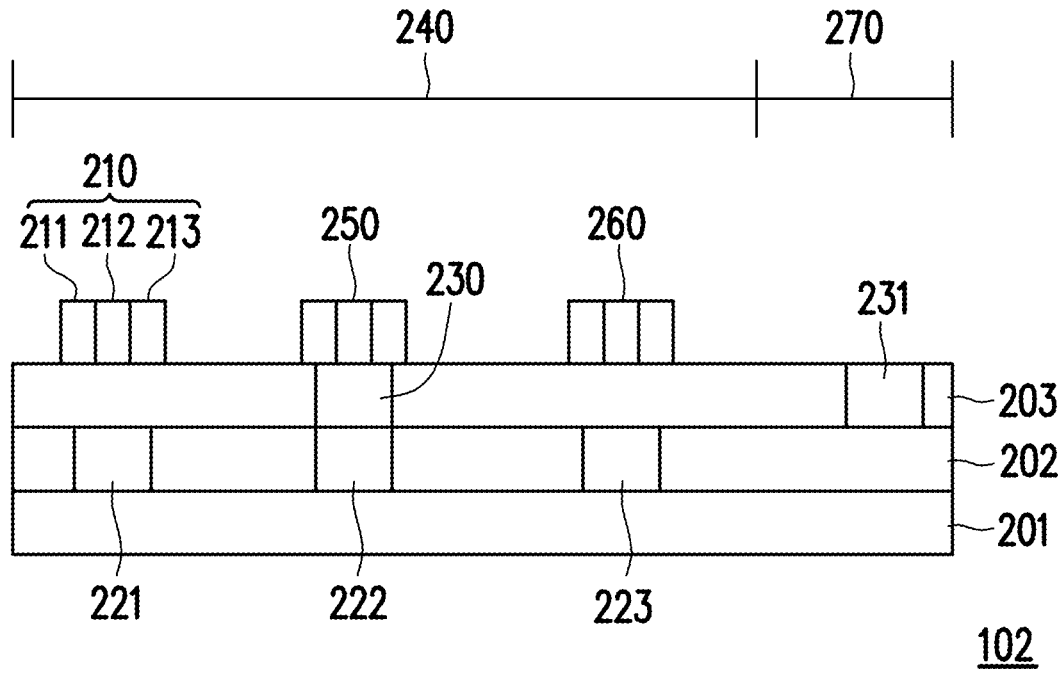
FIG. 2 is a cross-sectional view illustrating a display panel according to an embodiment.

FIG. 2 is a cross-sectional view of the display panel according to an embodiment. Referring to FIG. 2, the display panel 102 includes a substrate 201 and multiple layers 202-203. Multiple micro integrated circuits 221-223 are disposed in the layer 202, the temperature sensors 230, 231 are disposed in the layer 203, and the pixel structures 211-213, 250, 260 are disposed on the layer 203. The pixel structures 211-213 display different colors, for example, red, green, and blue respectively. Each pixel structure 211-213 is also referred to as a subpixel, and the pixel structures 211-213 are collectively referred to as a pixel 210. The positions of the components in FIG. 2 are only illustrative. In other embodiments, the pixel structures, temperature sensors, and micro integrated circuits may be disposed arbitrarily in one or more layers. For example, the temperature sensors 230, 231 and the micro integrated circuits 221-223 may be disposed in the same layer, or the pixel structures 211-213 may be disposed in the same layer as the micro integrated circuits 221-223. In some embodiments, the temperature sensor 230 or the micro integrated circuits 221-223 may be disposed on the lower surface of the substrate 201. In some embodiments, the temperature sensor 230 may be disposed below the micro integrated circuits 221-223. The present disclosure is not limited to the configuration positions shown in FIG. 2.

In this embodiment, the temperature sensor 230 is used to sense a temperature value, and each micro integrated circuit 221-223 includes a temperature compensation circuit used to perform temperature compensation based on this temperature value. This is because light-emitting diodes have a problem of brightness degradation as temperature increases. For example, referring to FIG. 3, FIG. 3 is a table illustrating brightness degradation according to an embodiment. Table 300 shows the brightness of a certain micro light-emitting diode and the corresponding temperature. From the table 300, it can be seen that as the temperature rises, the brightness of the micro light-emitting diode gradually decreases. Therefore, when the temperature rises, the driving current of the micro light-emitting diode must be increased to achieve the expected brightness.

In FIG. 2, the number of temperature sensors is less than the number of pixel structures in the display panel. Each temperature sensor 230 corresponds to an area 240, which contains a portion of all pixel structures. A down-sampling position is set for this area 240, and the temperature compensation is based on the temperature at this down-sampling position. If the down-sampling position matches the position of the temperature sensor 230, for example, if the down-sampling position is identical to the position of pixel structure 250, the temperature value sensed by the temperature sensor 230 may be directly used as a compensation temperature value. If the down-sampling position does not match the position of the temperature sensor 230, for example, if the down-sampling position is identical to the position of pixel structures 211-213 or pixel structure 260, it is necessary to predict the temperature value at the down-sampling position. For instance, a temperature sensor 231 corresponds to an area 270 in the pixel array, which is adjacent to the area 240, and the temperature sensor 231 also obtains a temperature value. When the down-sampling position within area 240 is different from the position of temperature sensor 230 (for example, identical to the position of pixel structure 260), the temperature value at the down-sampling position (also called the compensation temperature value) may be interpolated based on the temperature value obtained by temperature sensor 230 and the temperature value obtained by temperature sensor 231. In other words, the compensation temperature value may be either directly using the temperature value obtained by temperature sensor 230 or calculated through interpolation. FIG. 2 illustrates one-dimensional interpolation, but since the temperature sensors are distributed in two dimensions in the display panel, two-dimensional interpolation may be used to calculate the compensation temperature value. In some embodiments, bilinear interpolation is used, but the present disclosure is not limited to this.

In this embodiment, a lookup table is used for temperature compensation, and particularly, this lookup table is updated for each frame. Moreover, different down-sampling positions are used for different frames. The following embodiments will explain these technical means in detail.

Figure 4:
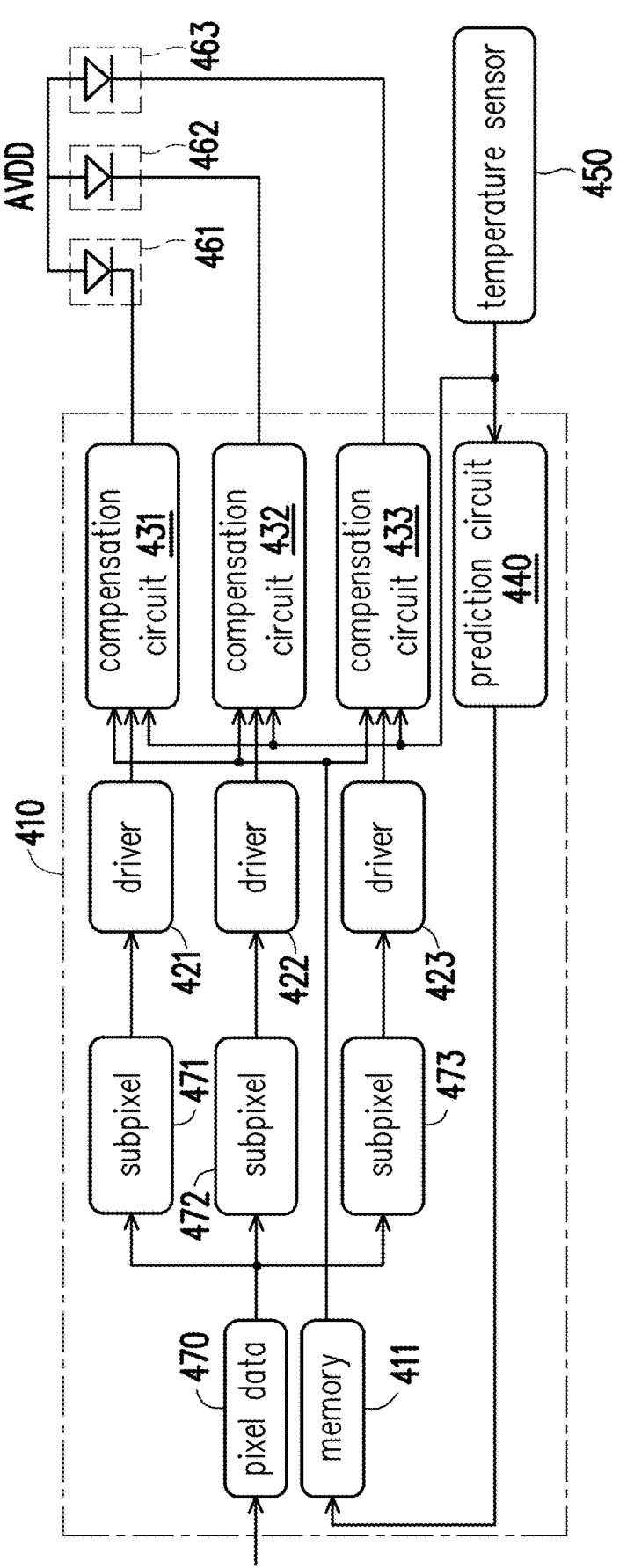
FIG. 4 is a schematic diagram illustrating a temperature compensation circuit, a temperature sensor, and a pixel structure according to an embodiment.

FIG. 4 is a schematic diagram illustrating a temperature compensation circuit, temperature sensors, and pixel structures according to an embodiment. Referring to FIG. 4, the temperature compensation circuit 410 includes a memory 411, drivers 421-423, compensation circuits 431-433, and a prediction circuit 440. The memory 411 stores a lookup table, and the memory 411 is electrically connected to the compensation circuits 431-433. In addition, the temperature sensor 450 is electrically connected to the compensation circuits 431-433 and the prediction circuit 440. Pixel structures 461-463 are located in the area corresponding to the temperature sensor 450. Each of the pixel structures 461-463 includes a light-emitting diode (which may be a micro light-emitting diode or a light-emitting diode of other sizes).

Figure 5:
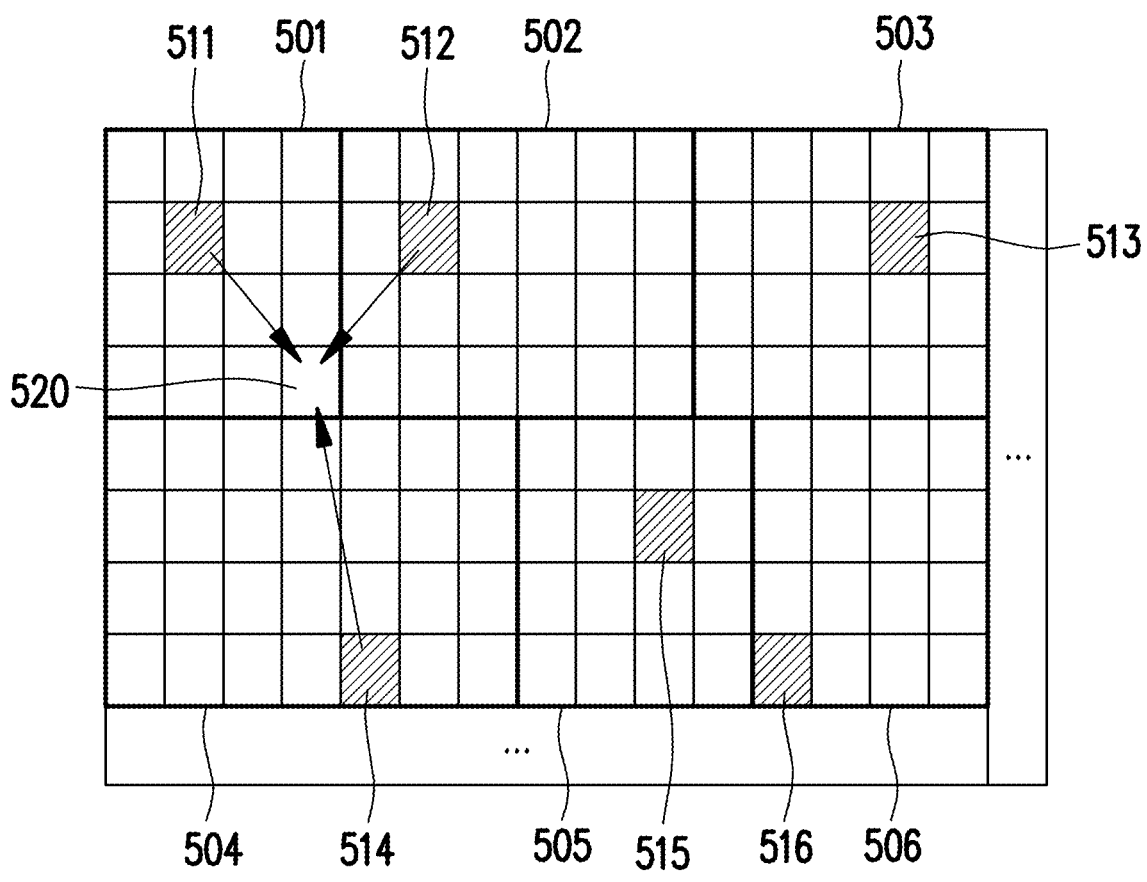
FIG. 5 is a schematic diagram illustrating down-sampling positions according to an embodiment.

The temperature compensation circuit 410 obtains pixel data 470 belonging to a certain frame, and obtain subpixels 471-473 belonging to a certain pixel from the pixel data 470. These subpixels 471-473 are transmitted to the drivers 421-423. The drivers 421-423 may calculate 3 subpixel values based on algorithms such as over-drive or gamma correction. These 3 subpixel values correspond to the pixel structures 461-463 respectively. Here, it is assumed that the down-sampling position is identical to the position of pixel structure 461, which means temperature compensation is to be performed on the pixel structure 461. FIG. 5 is a schematic diagram illustrating down-sampling positions according to an embodiment. Referring to FIG. 5, multiple areas 501-506 are shown in FIG. 5, each of the area 501-506 includes a temperature sensor (not shown in FIG. 5), and down-sampling positions 511-516 are set in the areas 501-506, respectively. Referring to FIG. 4 and FIG. 5, it is assumed that the temperature sensor 450 and the pixel structures 461-463 are in the area 501.

The temperature sensor 450 would obtain a temperature value which is transmitted to the prediction circuit 440. The prediction circuit 440 obtains a compensation temperature value at the down-sampling position 511 according to this temperature value. As mentioned above, when the down-sampling position 511 is different from the position of the temperature sensor 450, the prediction circuit 440 interpolates the compensation temperature value based on multiple temperature values; if the down-sampling position 511 is identical to the position of the temperature sensor 450, the prediction circuit 440 sets the compensation temperature value to be identical to the temperature value measured by the temperature sensor 450. The prediction circuit 440 transmits the compensation temperature value to the memory 411. Next, the subpixel value at the down-sampling position 511 is obtained, and based on this subpixel value and the compensation temperature value, the lookup table in the memory 411 is queried to obtain a compensation value.

Figure 6:
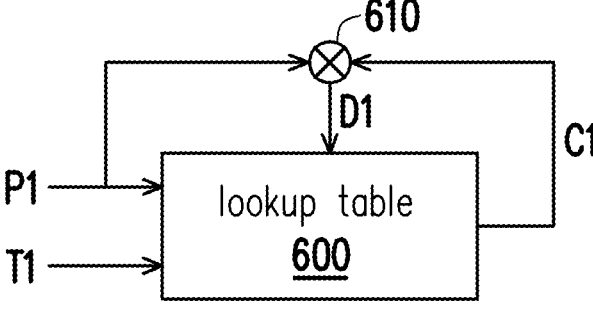
FIG. 6 is a schematic diagram illustrating the calculation of drive values according to an embodiment.

After obtaining the compensation value, it is transmitted to the compensation circuit 431. The compensation circuit 431 generates a drive value based on the original subpixel value and the compensation value. In some embodiments, the compensation value is a numerical value such as +1 or −1, and the temperature compensation circuit 410 may add the compensation value to the subpixel value to obtain the drive value. In some embodiments, the compensation value is an absolute gray-level value such as 128 or 250. In such examples, the temperature compensation circuit 410 sets multiple weights and calculate a weighted sum of the subpixel value and the compensation value based on these weights to serve as the drive value. FIG. 6 is a schematic diagram illustrating the calculation of the drive value according to an embodiment. Referring to FIG. 6, assume that the subpixel value at the down-sampling position is represented as P1, and T1 is the compensation temperature value corresponding to the down-sampling position. After inputting the subpixel value P1 and the compensation temperature value T1 into the lookup table 600, a compensation value C1 is obtained. Next, a weighted sum calculation 610 is performed, as shown in the following Mathematical Formula 1.

$$D1 = W_1 \times P1 + W_2 \times C1 \qquad \text{[Mathematical Formula 1]}$$

Where $W_1$ and $W_2$ are weights. In some embodiments, $W_1 + W_2 = 1$. For example, $W_1 = 0.5$, $W_2 = 0.5$; or $W_1 = 0.1$, $W_2 = 0.9$ may also be set.

After calculating the drive value D1, the pixel structure 461 located at the down-sampling position 511 is driven based on this drive value D1 and the system voltage AVDD. Furthermore, the temperature compensation circuit 410 also updates the lookup table 600 according to this drive value D1. In this embodiment, the lookup table 600 is updated once for each frame, so that updated information will be used in subsequent frames.

For example, the aforementioned subpixel value P1 belongs to a first frame. When updating the lookup table 600, the compensation value C1 corresponding to the subpixel value P1 and the compensation temperature value T1 is replaced with the drive value D1. When the temperature compensation circuit 410 receives the subpixel value of the next frame (referred to as a second frame, and the subpixel value is referred to as a second subpixel value), the temperature sensor 450 also obtains a corresponding temperature value (referred to as a second temperature value). The prediction circuit 440 similarly obtains a second compensation temperature value based on the second temperature value. This second subpixel value and the second compensation temperature value are input into the lookup table 600. If the second subpixel value is identical to the subpixel value P1 and the second compensation temperature value is identical to the compensation temperature value T1, the value retrieved from the lookup table 600 at this time will not be the compensation value C1, but the drive value D1. Subsequently, the temperature compensation circuit 410 generates a second drive value based on the drive value D1 and the second subpixel value to drive the corresponding pixel structure (which may be the pixel structure 461 or other pixel structures). In other words, the lookup table 600 is used to calculate new drive values for each frame, and the new drive values are used to update the lookup table 600.

In some embodiments, the pixel structures 461-463 belong to different colors, and the pixel structures 461-463 use three separate lookup tables respectively. In this embodiment, one temperature compensation circuit 410 corresponds to three pixel structures 461-463, but the present disclosure is not limited to this. In other embodiments, the temperature compensation circuit 410 may have only one set of memory, driver, and compensation circuit, and the temperature compensation circuit 410 is dedicated to a single pixel structure. In other embodiments, one temperature compensation circuit may correspond to more pixel structures (e. g., 6, 9, 12), and the lookup table in the memory 411 may be applicable to multiple pixels. In some embodiments, the position of the temperature sensor 450 is set to be identical to the positions of the three pixel structures 461-463, but in other embodiments, the position of the temperature sensor 450 may be set to be identical to the position of only one pixel structure.

Refer to FIG. 5, the aforementioned calculation is about the temperature compensation at the down-sampling position 511. For other positions within the same area, temperature compensation may be performed using interpolation. For example, the aforementioned drive value D1 is called a first drive value. In the same manner, the temperature compensation circuit calculates a drive value (called a second drive value) corresponding to the down-sampling position 512 in the area 502. Similarly, a drive value (called a third drive value) is calculated for the down-sampling position 514 in the area 504. Based on the first to third drive values, a difference value may be interpolated, which corresponds to a pixel structure (e.g., pixel structure 520) within the range formed by the down-sampling positions 511, 512, and 514. In this example, the pixel structure 520 is in the area 501. In some embodiments, the calculation of the aforementioned difference value includes first subtracting the previously displayed gray-level values corresponding to the down-sampling positions from the drive values to obtain three down-sampling difference values. Specifically, subtracting the previously displayed gray-level value at the down-sampling position 511 from its drive value yields the first down-sampling difference value, subtracting the previously displayed gray-level value at the down-sampling position 512 from its drive value yields the second down-sampling difference value, and subtracting the previously displayed gray-level value at the down-sampling position 514 from its drive value yields the third down-sampling difference value. Next, a two-dimensional interpolation is performed on these three down-sampling difference values to obtain the difference value corresponding to the pixel structure 520. Finally, this difference value is added to the subpixel value corresponding to the pixel structure 520, thus completing the temperature compensation. This process may be applied similarly to other pixel structures in the areas 501, 502, and 504.

In some embodiments, the pixel structure 520 may also have a corresponding temperature compensation circuit, which includes a lookup table applicable to pixel structure 520. After performing the aforementioned temperature compensation for pixel structure 520, the corresponding lookup table may also be updated according to the compensated drive value.

In some embodiments, the size and position of areas 501 to 506 are determined according to the locations of the temperature sensors. The number and placement of the temperature sensors may be decided based on factors such as the applicable environment, cost, and sensor size. For example, more temperature sensors may be disposed in areas of the electronic device that are more prone to heat generation.

Figure 7:
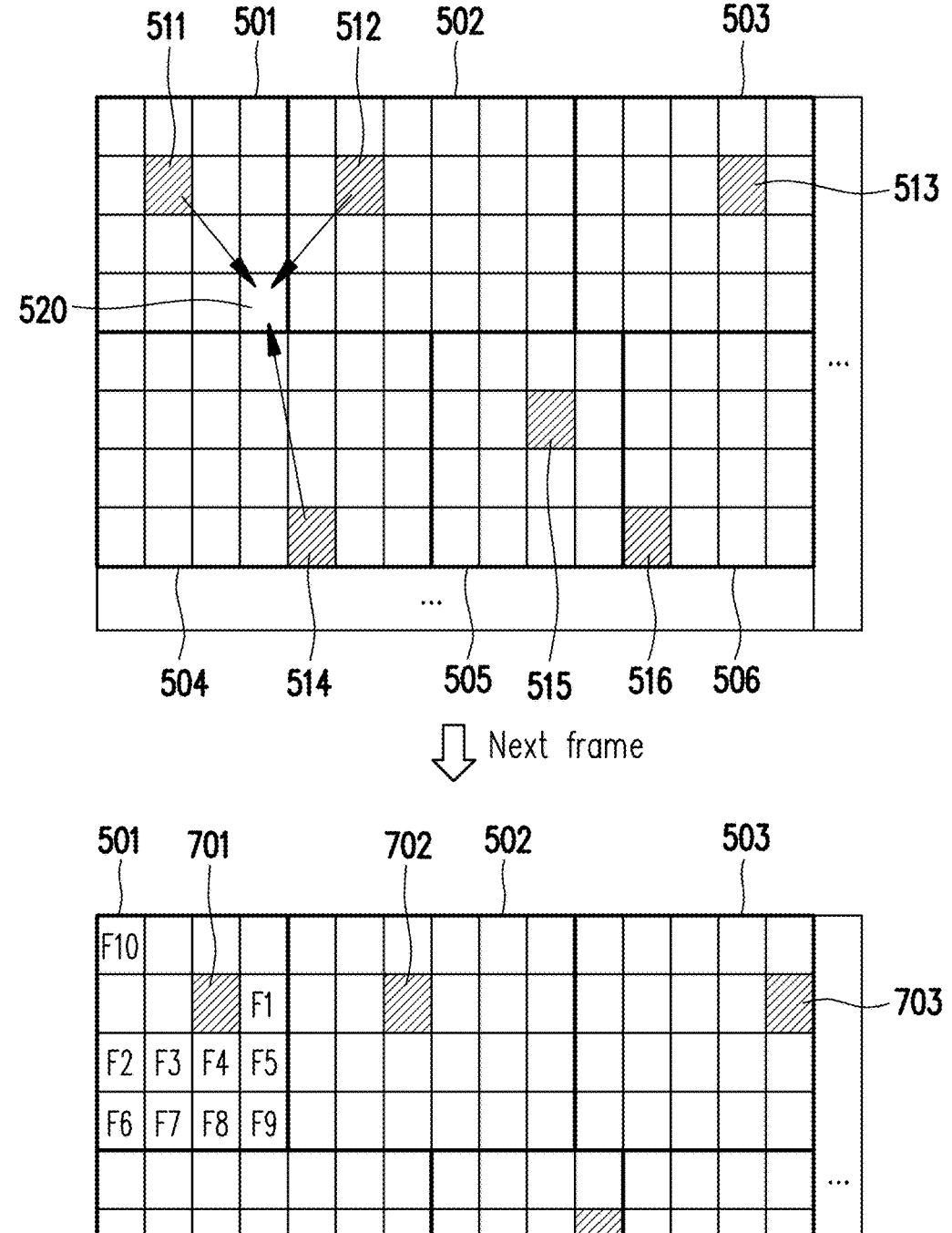
FIG. 7 is a schematic diagram illustrating the update of down-sampling positions according to an embodiment.

In some embodiments, the temperature compensation circuit 410 sets different down-sampling positions for different frames, which can avoid continuously using the temperature at a particular position having an exceptionally high temperature that may cause unexpected compensation. FIG. 7 is a schematic diagram illustrating the updating of down-sampling positions according to an embodiment. Refer to FIG. 7, the upper half of FIG. 7 shows the configuration for the first frame, which is identical to FIG. 5, while the lower half shows the configuration for the next frame (referred to as the second frame). When switching from the first frame to the second frame, the temperature compensation circuit 410 changes the down-sampling positions 511 to 516 within each area 501 to 506 to generate updated sampling positions 701 to 706 in the areas 501 to 506 respectively. For example, the updated sampling position 701 is shifted one pixel structure to the right compared to the down-sampling position 511, and so on. Next, the aforementioned steps are repeated. Refer to FIG. 4 and FIG. 7, taking the area 501 as an example, a second subpixel value corresponding to the updated sampling position 701 is obtained, where this second subpixel value belongs to the second frame. Similarly, the temperature sensor 450 obtains a second temperature value corresponding to the second frame. Then, the prediction circuit 440 obtains a second compensation temperature value according to the second temperature value, and queries the lookup table in the memory 411 based on the second subpixel value and the second compensation temperature value to obtain a second compensation value. Subsequently, a second drive value is generated (as in Mathematical Formula 1) according to the second subpixel value and the second compensation value to drive the pixel structure located at the updated sampling position 701.

In some embodiments, the down-sampling position is moved by one pixel structure each time the frame changes. If all positions within one area have been gone through, the process may start over again. For example, in the next 9 frames, the down-sampling positions may be set to positions F1 to F9 respectively, and then in the 10th frame, the down-sampling position may be set to the top-left position F10, and so on. In other words, if there are N pixel structures in the area 501, the temperature compensation circuit 410 will set the updated sampling positions to correspond to N pixel structures over a period of N frames, where N is a positive integer.

FIG. 8 is a flowchart illustrating a temperature compensation method according to an embodiment. Referring to FIG. 8, in step 801, a first temperature value is obtained through a first temperature sensor, where the first temperature sensor corresponds to a first area in the pixel array, and this first area includes a portion of the pixel structures. In step 802, a down-sampling position in the first area is set, and a first subpixel value corresponding to the down-sampling position is received. In step 803, a first compensation temperature value at the down-sampling position is obtained according to the first temperature value. In step 804, a first compensation value is obtained by querying a lookup table based on the first subpixel value and the first compensation temperature value. In step 805, a first drive value is generated according to the first subpixel value and the first compensation value to drive the first pixel structure located at the down-sampling position, and the lookup table is updated according to the first drive value. Each step in FIG. 8 has been explained in detail as above, so the description will not be repeated here. It is worth noting that each step in FIG. 8 may be implemented as multiple instruction codes or circuits, and the present disclosure is not limited in this regard. For example, the process in FIG. 8 may be implemented as the temperature compensation circuit 410. In some embodiments, the process in FIG. 8 may be implemented as a driving circuit in the display device. In addition, the method of FIG. 8 may be used in conjunction with the above embodiments or used independently. In other words, other steps may also be added between the steps of FIG. 8.

In the above-mentioned display device and temperature compensation method, after using the lookup table for temperature compensation, the lookup table will be updated. Therefore, the lookup table is continuously updated over time. Furthermore, the aforementioned temperature compensation circuit may be disposed in the integrated circuit of the display area, which may reduce the area of the driving circuit outside the display area. On the other hand, the down-sampling position is changed in different frames, which avoids repeatedly using the temperature value of the same position for temperature compensation.

Although the present disclosure has been disclosed by the above embodiments, it is not intended to limit the invention. Any person skilled in the technical field may make minor modifications and refinements without departing from the spirit and scope of the present disclosure. Therefore, the protection scope of the present disclosure should be defined by the appended claims.

What is claimed is:

1. A display device, comprising:
   a display panel, comprising a pixel array, wherein the pixel array comprises a plurality of pixel structures;
   a first temperature sensor, corresponding to a first area in the pixel array, wherein the first area comprises a portion of the pixel structures, and the first temperature sensor is configured to obtain a first temperature value; and
   a temperature compensation circuit, electrically connected to the first temperature sensor, and configured to set a down-sampling position in the first area, and receive a first subpixel value corresponding to the down-sampling position, wherein the temperature compensation circuit is config-
ured to obtain a first compensation temperature value at
the down-sampling position according to the first tem-
perature value, query a lookup table according to the
first subpixel value and the first compensation tempera-
ture value to obtain a first compensation value, generate
a first drive value according to the first subpixel value
and the first compensation value to drive a first pixel
structure located at the down-sampling position, and
update the lookup table according to the first drive
value, wherein a second area is adjacent to the first area, a third
area is adjacent to the first area and the second area, wherein the temperature compensation circuit is config-
ured to calculate a second drive value at a down-
sampling position of the second area, and calculate a
third drive value at a down-sampling position of the
third area, for a second pixel structure within a range formed by the
down-sampling positions of the first area, the second
area, and the third area, the temperature compensation
circuit is configured to interpolate a difference accord-
ing to the first drive value, the second drive value and
the third drive value, and adjust a subpixel value
corresponding to the second pixel structure according
to the difference, wherein the second pixel structure is
different from the first pixel structure, wherein the temperature compensation circuit is config-
ured to change the down-sampling positions of the first
area, the second area, and the third area for different
frames.

2. The display device of claim 1, wherein the first subpixel
value belongs to a first frame, and the temperature compen-
sation circuit replaces the first compensation value in the
lookup table with the first drive value, wherein the temperature compensation circuit is config-
ured to receive a second subpixel value belonging to a
second frame, and the first temperature sensor is con-
figured to obtain a second temperature value, the temperature compensation circuit is configured to
obtain a second compensation temperature value
according to the second temperature value, wherein when the second subpixel value is identical to the
first subpixel value and the second compensation tem-
perature value is identical to the first compensation
temperature value, the temperature compensation cir-
cuit obtains the first drive value from the lookup table,
and generates a second drive value according to the first
drive value and the second subpixel value to drive one
of the pixel structures.

3. The display device of claim 1, further comprising:
a second temperature sensor, corresponding to the second
area in the pixel array, wherein the second temperature
sensor is configured to obtain a second temperature
value, wherein if the down-sampling position of the first area is
different from a position of the first temperature sensor,
the temperature compensation circuit is configured to
interpolate the first compensation temperature value
according to the first temperature value and the second
temperature value, wherein if the down-sampling position of the first area is
identical to the position of the first temperature sensor,
the temperature compensation circuit is configured to
set the first compensation temperature value to be
identical to the first temperature value.

4. The display device of claim 1, wherein the first subpixel
value belongs to a first frame, wherein for a second frame, the temperature compensa-
tion circuit is configured to change the down-sampling
position of the first area to generate an updated sam-
pling position in the first area, and obtain a second
subpixel value corresponding to the updated sampling
position, wherein the second subpixel value belongs to
the second frame, wherein the first temperature sensor also obtains a second
temperature value corresponding to the second frame, the temperature compensation circuit is configured to
obtain a second compensation temperature value at the
updated sampling position according to the second
temperature value, query the lookup table according to
the second subpixel value and the second compensation
temperature value to obtain a second compensation
value, and generate a second drive value according to
the second subpixel value and the second compensation
value to drive the pixel structure located at the updated
sampling position.

5. The display device of claim 4, wherein the first area
comprises N pixel structures, the temperature compensation
circuit is configured to set the updated sampling position to
correspond to the N pixel structures respectively during N
frames, wherein N is a positive integer.

6. The display device of claim 1, wherein the temperature
compensation circuit is configured to set a plurality of
weights, calculate a weighted sum of the first subpixel value
and the first compensation value according to the weights to
serve as the first drive value.

7. The display device of claim 1, wherein the temperature
compensation circuit is disposed in an integrated circuit, and
the integrated circuit is located in a display area of the
display panel.

8. The display device of claim 7, wherein the temperature
compensation circuit comprises a memory configured to
store the lookup table.

9. The display device of claim 1, wherein each of the pixel
structures comprises a micro light-emitting diode.

10. A temperature compensation method for a display
panel, wherein the display panel comprises a pixel array, the
pixel array comprises a plurality of pixel structures, and the
temperature compensation method comprises:

obtaining a first temperature value through a first tem-
perature sensor, wherein the first temperature sensor
corresponds to a first area in the pixel array, and the first
area comprises a portion of the pixel structures;

setting a down-sampling position in the first area, and
receiving a first subpixel value corresponding to the
down-sampling position, wherein a second area is
adjacent to the first area, a third area is adjacent to the
first area and the second area;

obtaining a first compensation temperature value at the
down-sampling position according to the first tempera-
ture value;

querying a lookup table according to the first subpixel
value and the first compensation temperature value to
obtain a first compensation value;

generating a first drive value according to the first sub-
pixel value and the first compensation value to drive a
first pixel structure located at the down-sampling posi-
tion, and updating the lookup table according to the first
drive value;

calculating a second drive value at a down-sampling
position of the second area, and calculate a third drive
value at a down-sampling position of the third area;

for a second pixel structure within a range formed by the down-sampling positions of the first area, the second area, and the third area, interpolating a difference according to the first drive value, the second drive value and the third drive value, and adjusting a subpixel value corresponding to the second pixel structure according to the difference, wherein the second pixel structure is different from the first pixel structure; and changing the down-sampling positions of the first area, the second area, and the third area for different frames.

11. The temperature compensation method of claim 10, wherein the first subpixel value belongs to a first frame, the temperature compensation method further comprises:

replacing the first compensation value in the lookup table with the first drive value;

receiving a second subpixel value belonging to a second frame, and obtaining a second temperature value through the first temperature sensor;

obtaining a second compensation temperature value according to the second temperature value; and when the second subpixel value is identical to the first subpixel value and the second compensation temperature value is identical to the first compensation temperature value, obtaining the first drive value from the lookup table, generating a second drive value according to the first drive value and the second subpixel value to drive one of the pixel structures.

12. The temperature compensation method of claim 10, further comprising:

obtaining a second temperature value through a second temperature sensor, wherein the second temperature sensor corresponds to the second area in the pixel array;

if the down-sampling position of the first area is different from the position of the first temperature sensor, interpolating the first compensation temperature value according to the first temperature value and the second temperature value; and if the down-sampling position of the first area is identical to the position of the first temperature sensor, setting the first compensation temperature value to be identical to the first temperature value.

13. The temperature compensation method of claim 10, wherein the first subpixel value belongs to a first frame, and the temperature compensation method further comprises:

for a second frame, changing the down-sampling position of the first area to generate an updated sampling position in the first area, and obtaining a second subpixel value corresponding to the updated sampling position, wherein the second subpixel value belongs to the second frame;

obtaining a second temperature value corresponding to the second frame through the first temperature sensor;

obtaining a second compensation temperature value at the updated sampling position according to the second temperature value; and querying the lookup table according to the second subpixel value and the second compensation temperature value to obtain a second compensation value, generating a second drive value according to the second subpixel value and the second compensation value to drive the pixel structure located at the updated sampling position.

14. The temperature compensation method of claim 13, wherein the first area comprises N pixel structures, and the temperature compensation method further comprises:

setting the updated sampling position to correspond to the N pixel structures respectively during N frames, wherein N is a positive integer.

15. The temperature compensation method of claim 10, wherein the step of generating the first drive value according to the first subpixel value and the first compensation value comprises:

setting a plurality of weights, calculating a weighted sum of the first subpixel value and the first compensation value according to the weights to serve as the first drive value.

16. The temperature compensation method of claim 10, wherein each of the pixel structures comprises a micro light-emitting diode.

* * * * *